United States Patent [19]

Walles

[11] Patent Number: 4,457,977
[45] Date of Patent: Jul. 3, 1984

[54] METALLIZED PLASTIC ARTICLES

[75] Inventor: Wilhelm E. Walles, Freeland, Mich.

[73] Assignee: The Dow Chemical Company, Midland, Mich.

[21] Appl. No.: 307,054

[22] Filed: Sep. 30, 1981

[51] Int. Cl.³ .............................................. B65D 1/00
[52] U.S. Cl. ................... 428/463; 427/306; 428/35; 428/461; 428/515; 428/518; 428/520
[58] Field of Search ................ 428/35, 461, 463, 516, 428/518, 515; 427/306

[56] References Cited

U.S. PATENT DOCUMENTS

| | | | |
|---|---|---|---|
| 3,467,540 | 9/1969 | Schick | 427/305 |
| 3,488,166 | 1/1970 | Kovac et al. | 427/306 |
| 3,616,190 | 10/1971 | Shaw | 428/35 |
| 3,625,751 | 12/1971 | Walles et al. | 428/341 |
| 3,828,960 | 8/1974 | Walles | 215/13 R |
| 3,916,048 | 10/1975 | Walles | 428/35 |
| 4,015,049 | 3/1977 | Yoda et al. | 428/461 |
| 4,049,904 | 9/1977 | Hori et al. | 428/461 |
| 4,089,993 | 5/1978 | Shirahata et al. | 427/306 |
| 4,310,578 | 1/1982 | Katsura et al. | 428/35 |
| 4,311,742 | 1/1982 | Otsuka | 428/35 |
| 4,345,005 | 8/1982 | All | 428/515 |
| 4,357,383 | 11/1982 | Howden et al. | 428/515 |

FOREIGN PATENT DOCUMENTS 1284805  8/1972  United Kingdom ................. 428/35

Primary Examiner—George F. Lesmes
Assistant Examiner—E. Rollins Buffalow

[57] ABSTRACT

A surface of a plastic article is metallized without substantial pinholes, holidays and the like by initially coating the surface with an aqueous colloidal dispersion of an organic polymer, particularly a barrier polymer such as polyvinylidene chloride, treating the organic polymer coating to make it metallizable and subsequently overcoating the treated organic polymer coating with a metal to form a thin metal layer adherent to the organic polymer layer. The resulting metallized plastic article which can optionally be treated with an additional amount of an aqueous colloidal dispersion of an organic polymer or metal is essentially impermeable to atmospheric gases and other vapors.

9 Claims, No Drawings

METALLIZED PLASTIC ARTICLES

BACKGROUND OF THE INVENTION

This invention relates to plastic articles which are essentially impermeable to gases, particularly to those articles with a plastic surface having an organic polymer layer and metal layer deposited thereon and to a method for preparing such articles.

In the manufacture of various articles, such as films for packaging oxygen sensitive materials including meats and dairy products and the boundary wall of a vacuum insulating container, from synthetic resinous materials, the resinous material is advantageously impermeable to atmospheric gases and other vapors. Unfortunately, most common organic polymers such as the polyolefins, e.g., polyethylene, polymers of the monovinylidene aromatics, e.g., polystyrene, and the like, are not sufficiently resistant by themselves to the transmission of atmospheric gases and other vapors to be useful in those applications requiring impermeable, resinous materials.

Accordingly, it has become a common practice to treat or coat such polymers with any of a variety of materials in order to make the polymers more resistant to the transmission of gases therethrough. For example, U.S. Pat. No. 3,459,591 discloses employing a barrier polymer such as a polymer of vinylidene or vinyl chloride to improve the impermeability of the resinous substrate. Alternatively, the permeability of the resinous material can be decreased using a metal coating. Unfortunately, the permeability of the resultant structures are relatively high thereby precluding their use in various high barrier applications such as vacuum insulating panels. Moreover, when metal layers of sufficient thickness to provide the required impermeability are employed, undesirably thick and rigid structures are often obtained. Normal flexure or crumpling of such thick, metal coated structures markedly reduces their barrier properties.

To improve the barrier properties of a plastic material using only a thin metal layer, U.S. Pat. No. 3,916,048 discloses depositing a metal layer on the surface of the plastic material and overcoating the metal layer using an aqueous colloidal dispersion of an organic polymer which is adherent to the metal layer. Unfortunately, due to the surface irregularities inherent in the manufacture of molded articles and surface dirt such as fingerprints, dust and the like, the metal coating on the support's surface exhibits substantial pinholes, holidays and the like. Due to said imperfections, a substantial proportion of the barriers prepared in the manner disclosed in U.S. Pat. No. 3,916,048 are not as impermeable to gases as desired for some applications. While an improved barrier may be prepared by cleaning the surface of the substrate prior to the metallization thereof, irregularities due to mold stresses in the substrate are still evident, thereby reducing the effectiveness of the plastic support as a barrier material.

Therefore, in view of the deficiencies of the prior art in the preparation of articles comprising an organic plastic, particularly those articles wherein the organic plastic has a cylindrical surface, it would be highly desirable to provide the surface of the plastic with improved impermeability using a thin metal coating having reduced amounts of pinholes, holidays and other imperfections.

SUMMARY OF THE INVENTION

Accordingly, the present invention is in one aspect an article embodying such an impermeable diffusion barrier structure. The diffusion barrier structure comprises a substrate of an organic plastic material having deposited on a surface thereof an organic polymer which is adherent to the plastic substrate. The organic polymer coating has a water-wettable surface which is overcoated with a metal layer adherent to the organic polymer layer.

In another aspect, the present invention is a method for preparing a diffusion barrier structure which comprises (1) applying an organic polymer to a surface of an organic plastic substrate to provide an essentially continuous coating adherent to the substrate, (2) rendering a surface of the organic polymer coating water-wettable and (3) metallizing the water-wettable surface of the organic polymer coating under conditions sufficient to provide a metal layer adherent to the organic polymer coating.

Surprisingly, it is found that when the metal is applied to the plastic surface coated with an organic polymer, the resulting metal layer possesses reduced amounts of pinholes, holidays and the like when compared to a plastic substrate having the metal coating applied directly to a water-wettable surface of the substrate. Therefore, the barrier structure of the present invention exhibits unexpectedly superior resistance to the transmission of atmospheric gases and other vapors therethrough.

In an embodiment of particular interest, the metal layer of the metallized plastic is subsequently coated with an aqueous colloidal dispersion of an organic polymer to provide an essentially continuous coating of the organic polymer adherent to the metal layer. In this manner, the resistance of the barrier plastic structure is further improved and the metal layer protected.

The plastic articles comprising the diffusion barrier structure of the present invention are useful as containers for oxygen sensitive materials such as meats, dairy products and the like, as packaging materials for a wide variety of other products which are sensitive to atmospheric gases and other vapors which normally permeate packages of organic polymers and as the structural plastic materials used in providing thermal insulative properties such as described by U.S. Pat. Nos. 3,828,960 and 3,993,811.

DETAILED DESCRIPTION OF THE PREFERRED EMBODIMENTS

The substrate of the organic polymer material is suitably fabricated from any normally solid, organic polymer. Preferably, the substrate is fabricated of polymers which are thermoplastic such as those which are easily fabricated into an article of desired shape using conventional techniques such as injection molding, extrusion molding, film blowing via the bubble process or similar techniques. Less preferably, a thermosetting polymer can be employed. In either case, the plastic material possesses sufficient strength and rigidity to withstand the handling and abuse to which the desired article is commonly subjected.

Exemplary polymers include the structural or engineering polymers such as polymers of α-monoolefins, e.g., polymers of ethylene, propylene, butenes including homopolymers and copolymers thereof and of other α-olefins having less than 12 carbon atoms; monovinylidene carbocyclic aromatic polymers, e.g., polystyrene, styrene/butadiene copolymers, styrene/acrylonitrile copolymers, styrene/butadiene/acrylonitrile polymers (so-called ABS polymers), styrene/maleic anhydride copolymers and others disclosed in U.S. Pat. Nos. 3,336,227 to Zimmerman et al. and 2,971,939 to Baer (so-called high temperature resins), copolymers of the monovinylidene aromatic monomers and other copolymerizable ethylenically unsaturated monomers; acrylic polymers such as poly(methyl methacrylate) and polymers of other alkyl esters of α,β-ethylenically unsaturated carboxylic acids such as ethyl acrylate, β-hydroxyethyl acrylate, ethyl hydrogen maleate, diethyl fumarate and the like; structural polymers of other ethylenically unsaturated monomers such as vinyl and vinylidene halides, e.g., vinyl chloride and vinylidene chloride, acrylonitrile, acrylamide, methyl vinyl ether, vinyl acetate, dienes such as butadiene and isoprene; polyformaldehyde resins; polyesters such as poly(ethylene terephthalate), polycarbonates, polysulfones, polyamides such as nylon and others.

In addition to the foregoing polymers, the plastic substrate may contain one or more additaments such as fillers, stabilizers, surface modifiers, dyes, gas absorbing materials, etc.

The thickness of the organic plastic substrate is not critical. It is understood that the thickness of the organic plastic substrate is sufficient if it provides the article manufactured therefrom with the desired mechanical properties (i.e., strength, rigidity, flexibility and the like). Generally, such thickness is advantageously in the range from about 0.01 to about 8 mm, preferably from about 0.02 to about 3 mm.

The organic polymer for coating the plastic substrate is suitably a normally solid organic polymer which will form an essentially continuous film at temperatures below the heat distortion temperature of the organic polymer of the organic plastic substrate. The organic polymer may be applied to the surface of the substrate in the form of an aqueous colloidal dispersion or as a solution in an organic solvent. For the purposes of this invention, the heat distortion temperature of a polymer is the minimum temperature at which an article fabricated of the polymer distorts as a result of being subjected to minimal outside forces.

Exemplary polymers advantageously employed include polymers, i.e., homopolymers and copolymers, of the following monomers: α-monoolefins such as ethylene, propylene, butene-1, isobutene and other α-monoolefins having less than 12 carbon atoms; monovinylidene aromatic carbocyclic monomers such as styrene, 2-methylstyrene, ar-t-butylstyrene, ar-chlorostyrene, vinyl naphthalene and the like; conjugated aliphatic dienes such as butadiene, isoprene and others having less than 12 carbon atoms; alkyl esters of α,β-ethylenically unsaturated carboxylic acids such as ethyl acrylate, methyl methacrylate, 2-hydroxyethyl acrylate, ethyl hydrogen maleate, dipropyl fumarate and others having up to 18 carbon atoms; unsaturated esters of carboxylic acids such as vinyl acetate, vinyl propionate and vinyl benzoate; vinyl and vinylidene halides such as vinyl chloride and vinylidene chloride; and other ethylenically unsaturated monomers such as acrylonitrile, methacrylonitrile, acrylamide, methyl vinyl ether, methyl benzyl ketone and the like. These polymers also may contain small amounts, e.g., up to about 15 weight percent, of emulsifying monomers, e.g., the α,β-ethylenically unsaturated carboxylic acids such as acrylic acid, methacrylic acid, fumaric acid, itaconic acid and the like.

Of such polymers, those exhibiting barrier characteristics are advantageously employed for coating the plastic substrate. For the purposes of this invention, a film of polymer exhibiting a permeability to gaseous nitrogen less than about 2.5 cubic centimeters for a 1 mm thick film of 1 square meter surface area per day at room temperature at a pressure difference of 1 atmosphere (cc-mm/$m^2$-atm-day) is a film of a polymer having barrier characteristics (a so-called barrier polymer). Films of preferred barrier polymers exhibit permeabilities less than about 0.4 cc-mm/$m^2$-atm-day. Exemplary barrier polymers include polymers of vinylidene chloride containing at least 50 weight percent, preferably at least 70 weight percent, of vinylidene chloride and a remaining amount of copolymerizable ethylenically unsaturated comonomer, such as those monomers listed hereinbefore. Of particular interest are vinylidene chloride/vinyl chloride copolymers, vinylidene chloride/acrylonitrile copolymers and the like, especially those described in U.S. Pat. No. 3,617,368 to Gibbs et al.

Also of interest are copolymers of ethylene and acrylic acid. Ethylene/acrylic acid copolymers exhibit barrier characteristics and, in addition, are water-wettable. The surfaces of said copolymers, therefore, may be readily metallized without additional treatment to render said surfaces amenable to metallization.

The organic polymer is applied in the form of a solution in an organic solvent or, preferably, an aqueous colloidal dispersion to the surface of the plastic substrate. As used herein, the term "aqueous colloidal dispersion" refers to a dispersion of colloidal size particles of the polymer in an aqueous medium (commonly referred to as a "latex") which may contain additives such as emulsifiers and modifiers commonly added to such dispersions. The organic polymer can be applied directly to the plastic substrate. However, due to the hydrophobic characteristics of many of the aforementioned polymers, the surface of the plastic substrate is advantageously treated to render it more water-wettable. Any conventional method for rendering the wall surface of the plastic water-wettable such as oxidation or sulfonation techniques can be employed in this invention. Preferably, the wall surface is rendered water-wettable by a gas phase sulfonation process such as described in U.S. Pat. No. 3,625,751 to Walles. Other techniques such as corona discharge, oxidation with chromic acid-sulfuric acid reagents, liquid phase sulfonation and the like can also be employed herein.

Following application, the organic polymer is dried at a temperature below the heat distortion point of the organic polymer of the substrate to form a continuous coating. Although maximum thickness of the coating is not particularly critical, the thickness of the resulting coating is advantageously sufficient to provide a coating weight in the range from about 5 to about 12,000 micrograms per square centimeter ($\mu g/cm^2$), preferably from about 60 to about 2,500 $\mu g/cm^2$. The coating of the organic polymer should be extensive enough to essentially cover the exposed surface of the plastic substrate. Advantageously, the organic polymer coating covers at least 95 percent of the exposed surface of the plastic substrate, preferably at least about 99 percent.

Since the coatings formed from the organic polymer are generally not readily metallizable, e.g., the subsequently applied metal layer will not adhere thereto, it is generally advantageous to treat the surface of the substrate to render it metallizable. Any conventional treatment for achieving this purpose is suitable for the purpose of this invention. In general, those treatments which render the coating water-wettable such as the oxidation and sulfonation treatments hereinbefore described are advantageously employed herein. Of such treatments, the sulfonation techniques disclosed in U.S. Pat. No. 3,625,751 are especially preferred.

Metallization is carried out by depositing a coating of a metal such as silver, lead, nickel, aluminum, copper, gold, titanium, tin, bismuth, antimony, chromium, manganese and the like including alloys thereof by known thermal evaporation, chemical vapor deposition, cathodic sputtering, electroplating or electroless plating techniques. Preferably, to obtain the most complete metal layer, i.e., that layer having the least imperfections, electroless plating techniques such as described by F. A. Lowenheim in *Metal Coating of Plastics*, Noyes Data Corporation (1970), particularly the contacting of the plastic substrate with a solution, generally an aqueous solution, of the metal in salt form and containing a reducing agent which precipitates the metal, are employed. See also, S. H. Pinner, et al. *Plastics: Surface and Finish*, Daniel Davey and Co., Inc., 172-186 (1971) and U.S. Pat. No. 2,464,143. In addition, other metals such as iron, cobalt and metals of the platinum group and their alloys are suitably used. Of the foregoing metals, silver, nickel or alloys thereof are preferred. In especially preferred embodiments, a tie coat of tin compound is deposited on the substrate plastic surface prior to deposition of one or more of the aforementioned preferred metals. If the tie coat of tin compound is applied, it is usually applied in amounts in the range from about 0.5 to about 50 $\mu g/cm^2$. The tie coat of tin compound is preferably applied by contacting the water-wettable surface of the plastic substrate with a dilute aqueous solution of a tin compound such as tin dichloride.

The quantity of metal deposited in forming the desired metal layer is that amount which forms an essentially continuous layer over the desired surface of the organic polymer and thereby renders the substrate practically impermeable. Preferably, the quantity of metal deposited is in the range from about 0.025 to about 2,500 $\mu g/cm^2$, especially from about 20 to about 1,000 $\mu g/cm^2$. The metal layer is advantageously extensive enough that the surface of the coated substrate requiring the metal is essentially completely covered. In this invention, the type of plastic substrate, organic polymer coating, and metal, the thickness of each layer thereof and the method of application of each layer are selected such that the metal layer, when applied to the coated plastic substrate rendered water-wettable by one of the aforementioned techniques, exhibits a reduced amount of open space due to pinholes, holidays and the similar defects than when the metal is applied directly to the plastic substrate which has been rendered water-wettable by the same techniques, i.e., the surface of the plastic substrate has not been coated with the polymer dispersion. For the purposes of this invention, such defects are identified by visual examination of the metal layer. If a thin, transparent organic substrate is employed, said defects are detected by shining a bright light through the film. Alternatively, defects can be detected by visual inspection under magnification of up to 40,000×. Advantageously, when examined by such techniques, the imperfections are seen to be reduced by at least about 50 percent, more preferably by at least about 80 percent.

Preferably, the metal covers at least about 99, more preferably at least about 99.5, percent of the coated plastic surface. Most preferably, essentially all the coated plastic surface is metallized, i.e., the metal layer covers at least about 99.9 percent of the metallized, coated plastic surface.

Following metallization of the coated plastic substrate, the resulting metallized plastic structure exhibits excellent resistance to the transmission of gases therethrough and can be employed as a barrier material in many applications without subsequent processing. Advantageously, however, the barrier properties are improved and the metal layer protected by coating the metal layer with an additional overcoating of an organic polymer. The organic polymers suitably employed in coating the organic plastic substrate are generally advantageously employed in overcoating the metal layer. Most preferably, those organic polymers exhibiting barrier characteristics as hereinbefore described are employed as the metal overcoat. Advantageously, the organic polymer is applied over the metal layer in the form of an aqueous colloidal dispersion of the organic polymer and subsequently dried to form a continuous overcoat at temperatures below the heat distortion point of the organic polymer of the substrate. Although maximum thickness of the overcoat is not particularly critical, the thickness of the resulting overcoat is advantageously sufficient to provide a coating weight in the range from about 5 to about 12,000 $\mu g/cm^2$, preferably from about 60 to about 2,500 $\mu g/cm^2$. The overcoating of the organic polymer should be extensive enough to essentially cover the exposed surface of the metal layer. Advantageously, the organic polymer overcoating covers at least 95 percent of the exposed surface of the metal layer, preferably at least about 99 percent.

Additional layers of metal and organic polymer can subsequently be applied to the resulting material using similar techniques to increase the resistance of the material to the transmission of gases and vapors therethrough.

An exemplary valuable utility for the barrier structure is a vacuum container having double wall construction wherein the barrier structure of this invention comprises both walls of the container as described in U.S. Pat. No. 3,828,960. It is found that such vacuum containers can retain a vacuum between the walls for periods of time sufficient to render them useful substitutes for glass and steel vacuum containers.

The following examples illustrate the manner in which the principles of the invention are applied but are not to be construed as limiting the scope of the invention.

EXAMPLE 1

Polystyrene is extruded into a film having a thickness of 95 $\mu m$. One surface of the film is surface sulfonated to a degree of about 0.2 microgram of sulfur trioxide equivalents per square centimeter by contacting the surface with dry air containing 2 percent sulfur trioxide at 25° C. for approximately one second.

The surface sulfonated film is coated with a vinylidene chloride polymer by applying a 35 percent solid aqueous colloidal dispersion having an average particle size of 0.22 micron using a Meyer rod. Excess amounts of the dispersion are allowed to drain off and the remaining dispersion dried to a continuous coating.

The coated surface of the film is then surface sulfonated to a degree of about 0.2 microgram of sulfur trioxide equivalents per square centimeter by contacting the surface with dry air containing 2 percent sulfur trioxide at 25° C. for approximately one second.

A metallizing bath is prepared by mixing one part each of the following solutions:

0.6 percent $Ag(NH_3)_2NO_3$ in $H_2O$ 0.30 percent NaOH in $H_2O$ and 0.15 percent glucose and 0.15 percent fructose in $H_2O$.

The surface sulfonated coated film is dipped into the bath and metallization is completed within 1 minute. The metallized film is removed from the bath and washed with water. The resultant film shows essentially no pinholes, holidays or similar defects on visual inspection.

The metallized film is overcoated using the polymer and techniques employed in coating the plastic substrate. The latex is dried to a continuous overcoat. A cross-section of the resultant metallized film is prepared and examined under a magnification of 1900×. A four-layer film is seen having a total thickness of about 108.5 μm of which 95 μm is attributable to the substrate. The polyvinylidene chloride coating on the substrate is measured to be 8.8 μm thick, the silver layer is 0.31 μm thick and the polyvinylidene chloride coating over the silver layer has a thickness of 4.4 μm. When tested for permeability, the oxygen transmission rate of the resultant film is found to be about 0.131 cc/m²/day/atm wherein oxygen transmission rate is determined using a mass spectrometer to measure permeated oxygen at 20° C. for 24 hours.

EXAMPLE 2

To illustrate the surprising effect of coating the plastic substrate with a barrier plastic and depositing a layer of metal onto the surface of the barrier plastic, several strips of 4 mil polystyrene film are surface sulfonated using the techniques described in Example 1 to provide a degree of substitution of 0.2 microgram of sulfur trioxide equivalents per square centimeter of film.

One strip is coated with a 1 mil thickness of the barrier plastic by applying a 35 percent solids polyvinylidene chloride latex using a draw-down bar.

One strip is metallized using the techniques of Example 1, depositing a silver layer of about 0.01 mil thickness onto the sulfonated surface of the polystyrene film.

A silver layer of 0.01 mil thickness is deposited on another strip of sulfonated polystyrene film. The silver layer is then surface sulfonated and overcoated as before with a 1 mil thickness of vinylidene chloride polymer.

One strip is coated as before with a 1 mil layer of a polyvinylidene chloride latex. The surface of the polyvinylidene chloride layer is surface sulfonated and a 0.01 mil layer of silver is deposited thereupon.

In like manner, a strip is overcoated with successive layers of polyvinylidene chloride of 1 mil thickness, 0.01 mil silver, 1 mil polyvinylidene chloride and 0.01 mil silver.

The various polystyrene strips so prepared and a strip of surface sulfonated film are tested for oxygen permeance and the results of oxygen transmission are recorded in Table I.

TABLE I

| Sample No. | Coating Type | Thickness[1] (mil) | Oxygen Transmission Rate cc/100 sq in/day/atm[2] |
|---|---|---|---|
| 1 | Barrier Plastic | 1.0 | .0085 |

TABLE I-continued

| Sample No. | Coating Type | Thickness[1] (mil) | Oxygen Transmission Rate cc/100 sq in/day/atm[2] |
|---|---|---|---|
|  | Silver | .01 |  |
| 2 | Barrier Plastic | 1.0 | <.0032 |
|  | Silver | .01 |  |
|  | Barrier Plastic | 1.0 |  |
|  | Silver | .01 |  |
| 3*[3] | Silver | 0.01 | .013 |
|  | Barrier Plastic | 1.0 |  |
| 4* | Silver | .01 | 20 |
| 5* | Barrier Plastic | 1.0 | 0.16 |
| 6* | None, surface sulfonated | — | 75 |

*Not an example of this invention.
[1]Visually measured under magnification of approximately 30,000–40,000 ×.
[2]Determined by using a mass spectrometer to measure $O_2$ permeance at 20° C. for 24 hours.
[3]A polystyrene film of 5 mil thickness was employed as the substrate in this sample.

As shown in Table I, the barrier structures of the present invention, Samples 1 and 2, exhibit barrier characteristics clearly superior to those of previously known barrier structures (Samples 3–5).

What is claimed is:

1. A diffusion barrier structure comprising a substrate of an organic plastic material having an adherent continuous coating of an organic polymer which exhibits a permeance to gases of the atmosphere of less than 0.4 cc-mm/m²-atm-day deposited on the surface thereof, wherein said coating has a coating weight from about 60 to about 2500 micrograms per square centimeter, said organic polymer having a water-wettable surface which has a continuous metal layer having a total weight from about 20 to 10 μg/cm² deposited thereon and adherent thereto.

2. The diffusion barrier structure of claim 1 wherein the metal layer is coated with an organic polymer which adheres to the metal layer, said organic polymer being applied to the metal layer in the form of an aqueous colloidal dispersion.

3. The diffusion barrier structure of claim 1 wherein the organic polymer is a vinylidene chloride copolymer.

4. The diffusion barrier structure of claim 1 wherein the metal is silver.

5. A method for preparing a diffusion barrier structure, said method comprising the steps of (1) applying an organic polymer which exhibits a permeance to gases of the atmosphere of less than 0.4 cc-mm/m²-atm-day to at least one surface of an organic plastic substrate to provide an essentially continuous coating adherent to the plastic substrate of the organic polymer, wherein said coating has a coating weight from about 60 to about 2500 micrograms per square centimeter, (2) rendering a surface of the organic polymer coating water-wettable and (3) metallizing the water-wettable surface of the organic polymer coating at conditions sufficient to provide a metal layer having a total weight from about 20 to 10 μg/cm² adherent to said coating.

6. The method of claim 5 wherein the organic polymer is a polymer of vinylidene chloride, the organic polymer coating has a weight in the range from about 60–2500 micrograms per square centimeter, the surface of said organic polymer coating is rendered water-wettable by contacting said surface with sulfur trioxide, and the water-wettable surface is metallized by contacting the water-wettable surface with an aqueous solution of a water-soluble salt of a metal which solution further contains a reducing agent which is capable of reducing the metal such that a metal layer weighing from about 20–1000 micrograms per square centimeter is deposited on said water-wettable surface.

7. The method of claim 6 wherein the water-wettable surface of the organic polymer is coated with a tin compound having a coating weight of about 0.5 to 50 micrograms per square centimeter prior to the metallization thereof.

8. The method of claim 6 wherein the metal is silver or copper.

9. The method of claim 8 wherein the diffusion barrier structure has a permeance to oxygen of no more than about 0.0085 cc/100 in$^2$/day/atm.

* * * * *

UNITED STATES PATENT AND TRADEMARK OFFICE
CERTIFICATE OF CORRECTION

PATENT NO. : 4,457,977
DATED : July 3, 1984
INVENTOR(S) : Wilhelm E. Walles

It is certified that error appears in the above—identified patent and that said Letters Patent is hereby corrected as shown below:

Column 8, Claim 1, line 33, "20 to 10" should read --20 to 1000--.

Column 8, Claim 5, line 58, "to 10" should read --to 1000--.

Signed and Sealed this

Twenty-sixth Day of February 1985

[SEAL]

*Attest:*

DONALD J. QUIGG

*Attesting Officer*     *Acting Commissioner of Patents and Trademarks*